United States Patent [19]

Agrawal et al.

[11] Patent Number: 5,499,249
[45] Date of Patent: Mar. 12, 1996

[54] METHOD AND APPARATUS FOR TEST GENERATION AND FAULT SIMULATION FOR SEQUENTIAL CIRCUITS WITH EMBEDDED RANDOM ACCESS MEMORIES (RAMS)

[75] Inventors: Vishwani D. Agrawal, New Providence; Tapan J. Chakraborty, Mercerville, both of N.J.

[73] Assignee: AT&T Corp., Murray Hill, N.J.

[21] Appl. No.: 251,550

[22] Filed: May 31, 1994

[51] Int. Cl.$^6$ .................................................. G06F 11/00
[52] U.S. Cl. ............................................................ 371/25.1
[58] Field of Search ................................. 371/21.1, 21.2, 371/21.6, 22.2, 23, 25.1

[56] References Cited

U.S. PATENT DOCUMENTS

| | | | |
|---|---|---|---|
| 4,051,352 | 9/1977 | Eichelberger et al. | 364/716 |
| 4,769,817 | 9/1988 | Krohn et al. | 371/23 |
| 5,036,473 | 7/1991 | Butts et al. | 371/23 |

OTHER PUBLICATIONS

C. J. Lin and S. M. Reddy, "On Delay Fault Testing in Logic Circuits," *IEEE Trans. CAD*, vol. CAD-6, pp. 148-151, Sep. 1986.
Y. K. Malaiya and R. Narayanaswamy, "Modeling and Testing for Timing Faults in Synchronous Sequential Circuits," *IEEE Design and Test of Comput.*, vol. 1, pp. 62-74, Nov. 1984.
G. L. Smith, "Model for Delay Faults Based upon Paths," *Proc. Int'l Test Conf.*, pp. 342-349, 1985.
S. Davedas, "Delay Test Generation for Synchronous Sequential Circuits," *Proc. Int'l Test Conf.*, pp. 144-152, Sep. 1989.
Chakraborty et al., "Delay Fault Models & Test Generation for Random Logic Sequential Circuits," 1992, pp. 165-172, IEEE Design Automation Conf.
Agrawal et al., "Generating Tests for Delay Faults in Non-scan Circuits," 1993, pp. 20-28, IEEE Design & Test of Computers.
Chakraborty et al., "On Behavior Fault Modeling for Combinational Digital Designs," 1988, pp. 593-600, IEEE Int'l Test Conf.
Chakraborty et al., "Path Delay Fault Simulation Algorithms for Sequential Circuits," 1992, pp. 52-56, IEEE 1992.
Hill et al., "A Vector Based Backward State Justification Search for Test Generation in Sequential Circuits," pp. 630-637, IEEE 1990.
Cheng, "The Back Algorithm for Sequential Test Generation," pp. 66-69, IEEE 1988, Int'l Conf. on Computer Design.
Cheng et al., "GENTEST: An Automatic Test Generation System for Sequential Circuits," Apr. 1989, pp. 13-18, IEEE Computer.
Hill, "Interlocked Test Generation & Digital Hardware Synthesis," 1991, pp. 52-56, IEEE.
Lee et al., "A New Test Generation Method for Sequential Circuits," 1991, pp. 446-449.
Bollinger et al., "An Investigation of Circuit Partitioning for Parallel Test Generation," IEEE VLSI Test Symposium 1992, pp. 119-124.

*Primary Examiner*—Vincent P. Canney
*Attorney, Agent, or Firm*—R. B. Levy; R. D. Slusky

[57] ABSTRACT

Testing of a sequential circuit (10) containing at least one embedded RAM (16) is accomplished by first generating a set of sequential vectors and then applying the vectors in sequence to a set of primary circuit inputs ($PO_o$–$PO_j$). The vectors are generated such that upon application to the circuit, the vectors excite potential faults at nodes (A) upstream of the RAM and propagate the effects of the faults through the RAM to the primary circuit outputs ($PO_o$–$PO_j$). Also, the test vectors serve to excite faults downstream of the RAM by propagating values through the RAM needed to excite the downstream faults. The fault effects (if any) that propagate to the circuit primary outputs are compared to a set of reference values to determine if any faults are present.

6 Claims, 2 Drawing Sheets

(PARTIAL SCAN)

(FULL SCAN)

METHOD AND APPARATUS FOR TEST GENERATION AND FAULT SIMULATION FOR SEQUENTIAL CIRCUITS WITH EMBEDDED RANDOM ACCESS MEMORIES (RAMS)

TECHNICAL FIELD

This invention relates to a technique for testing a sequential circuit that contains at least one embedded RAM.

BACKGROUND OF THE INVENTION

Traditionally, sequential circuits that contain one or more sequential devices, such as flip-flops, am tested by applying one or more test vector sequences to the circuit at its primary inputs and then observing the response at the circuit outputs. The test vectors are generated such that upon application to the circuit, the vectors excite a fault (such as a "stuck-at-zero" or "stuck-at-one" fault) at one or more selected nodes of interest. For example, if a stuck-at-zero fault is present at a selected node, then the test vector sequence causes a logic "1" to be present at the selected node. In this way, a stuck-at-zero fault will manifest itself, causing a logic "0" rather than a logic "1" to appear at the selected node.

Simply exciting the fault condition at each selected node is generally insufficient for testing purposes because the faults at one or more selected nodes may not be observable at the circuit primary outputs. In other words, even though a fault may be excited at a selected node, the signals at the sequential circuit primary outputs may not change in response to the fault. Thus, for proper testing, the sequence of test vectors must excite the fault at each node of interest and must propagate the fault effect to one of the primary outputs of the sequential circuit to allow detection of the fault.

While the traditional test method just described is effective for most sequential circuits, this method does not work well for sequential circuits that contain one or more embedded RAMs. In practice, traditional test techniques have not been effective to propagate those logic values through an embedded RAM that are needed to excite a fault downstream of that RAM. Also, such techniques have not been effective to propagate the fault effect at an upstream node through the embedded RAM to a sequential circuit primary output. As a consequence, most sequential circuits that contain embedded RAMs are tested by excluding each RAM during the test so that the circuit appears purely sequential in nature. The disadvantage of this approach is that the degree of fault coverage, (i.e., the percentage of faults that can be detected) is likely to be low. Excluding the embedded RAMs during circuit testing prevents detection of those faults whose effect must be propagated through an embedded RAM in order to be observed.

Thus there is a need for a technique for testing a RAM-containing sequential circuit that affords high fault coverage.

SUMMARY OF THE INVENTION

Briefly, in accordance with a preferred embodiment of the invention, a technique is disclosed for testing a RAM-containing sequential circuit without the aforementioned disadvantages. The testing method is practiced by first generating at least one sequence of test vectors for application to the circuit. The test vectors are generated such that upon application, the vectors cause a fault upstream of the embedded RAM to be excited and cause the effect of such a fault to be propagated through the RAM to at least one primary output of the circuit. The vector sequence also causes logic values to propagate through the embedded RAM to excite a fault at a node downstream of the RAM and to propagate the effect of that fault to at least one primary circuit output. The fault effects (if any) that are propagated to the circuit outputs are compared to a set of reference values representing the circuit response under fault-free conditions. The difference between the fault effects propagated to the circuit outputs and the reference values is indicative of a fault condition.

DETAILED DESCRIPTION

General Circuit Description

Figure 1:
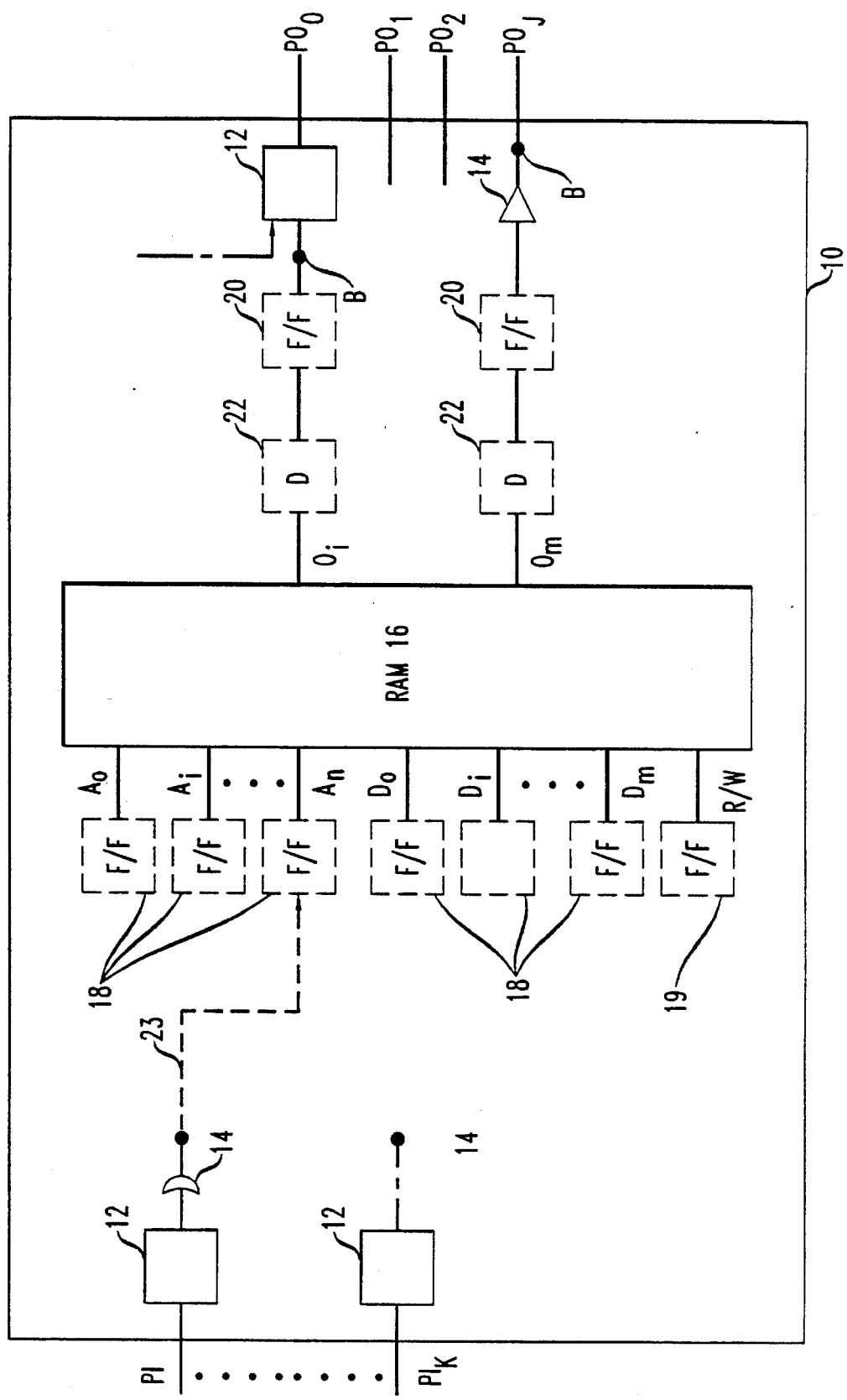
FIG. 1 is a schematic view of a sequential circuit that contains an embedded RAM.

FIG. 1 shows a sequential circuit 10 comprised of one or more sequential elements 12 (e.g., flip-flops) and one or more non-sequential logic elements 14, each of which may be an AND, OR, NAND, NOR, NOR or XOR gate or a comparator, depending on the function(s) of the circuit. In addition, the sequential circuit 10 shown in FIG. 1 includes at least one embedded Random Access Memory (RAM) 16 for storing dam. Although only one RAM 16 is shown, the circuit may include a plurality of such RAMs.

The RAM 16 has a set of address lines $A_o$–$A_n$ (where n is an integer greater than 0), a set of input data lines $D_o$–$D_m$ (where m is an integer greater than 0), a set of output lines $O_o$–$O_m$, and a read/write line (R/W). When a logic "0" signal is present on the read/write line R/W, the RAM 16 commences a write operation. During the write operation, the data values on the data lines $D_o$–$D_m$ are written into a row of storage cells (not shown) in the RAM. The location of the first cell in the row is given by the address value on the address lines $A_o$–$A_n$. When a logic "1" is present on the read/write line R/W, the RAM 16 commences a read operation. During a read operation, the data value stored in the row of storage cells whose first cell is located at the address value on the address lines $A_o$–$A_n$ is placed on the output lines $O_o$–$O_m$. The data value appearing on the output lines $O_o$–$O_m$ remains there until a subsequent read operation occurs.

Depending on the design of the sequential circuit 10, the RAM 16 may operate asynchronously such that the timing of signals to and from the RAM is not synchronized. Such asynchronous RAM operation is effected by having the address lines $A_o$–$A_n$, and the input data lines $D_o$–$D_m$ of the RAM 16 supplied directly with signals, either from the sequential elements 12, the non-sequential elements 14, and/or one or more of the primary inputs $PI_o$–$PI_k$ (where k is an integer greater than 0) of the sequential circuit 10. Similarly, when the RAM 16 operates asynchronously, each of the data output lines $O_o$–$O_m$ is directly coupled one or more of the sequential elements 12, the non-sequential elements 14, and/or the primary outputs $PO_o$–$PO_j$ of the sequential circuit 10 (where j is an integer greater than 0).

Rather than operate asynchronously, the RAM 16 may operate synchronously whereby the signals to and from the RAM are synchronized. To accomplish synchronous operation of the RAM 16, each of a set of flip-flops 18 (shown in phantom) is placed ahead of each of the address lines $A_o$–$A_n$ and each of the data lines $D_o$–$D_m$, respectively. In addition, a flip-flop 19 is placed ahead of the RAM 16 read/write line R/W. Also, for synchronous operation of the RAM 16, each of a set of flip-flops 20 is placed on an individual one of the RAM 16 output lines $O_o$–$O_m$. During synchronous operation of the RAM 16, the flip-flops 18, 19 and 20 are clocked in unison by a common clock pulse from a single clock (not shown) so as to synchronize the signals to and from the RAM. To avoid a race condition, which may otherwise occur when the flip-flops 18 and 20 are clocked simultaneously, a delay element 22 (shown in phantom) is inserted in each of the RAM output lines $O_o$–$O_m$ ahead of an individual one of the flip-flops 20, respectively. Alternatively, the read/write flip-flop 19 may be clocked separately from the flip-flops 18 and 20, thereby obviating the need for the delay elements 22.

Traditionally, testing of the sequential circuit 10 has been accomplished by applying sequences of test vectors to the circuit 10 at its primary inputs $PI_o$–$PI_k$ and then observing the signals at the circuit primary outputs $PO_o$–$PO_j$ generated in response to the test vectors. The response signals at the primary outputs are compared to a set of reference signals representing a fault-free condition. If a difference exists between the signals actually observed at the primary outputs $PO_o$–$PO_j$ of the circuit 10 and the reference signals, then a fault exists. There are a variety of techniques for generating a sequence of test vectors for exciting a fault at a selected node and for propagating its value to one of the primary outputs $PO_o$–$PO_j$ of the sequential circuit 10. One well-known technique utilizes the BACK algorithm described in the paper "Gentest: An Automated Test Generation System for Sequential Circuits," by W. T. Cheng et al., published in *Computer*, Vol. 22, pp. 43–49, April 1989. To accomplish test vector generation using the BACK algorithm, the propagation path between the node of interest and a primary output of the circuit 10 is established. Once the propagation path is established, the last vector in the test sequence needed to propagate the fault value forward from the last node in the path to the primary output is determined. Typically, the vector value is determined by computing the fault sequence backwards from the primary output to the last node in the fault path. Thereafter, the second-to-the-last test vector in the sequence needed to propagate the fault value forward from the second-to-the-last node to the last node is determined. Like the last vector, the second-to-the-last vector is determined by the computing the fault sequence backwards from the last node to the second-to-the-last node. This process is repeated until the first test vector in the sequence needed to propagate a value from a primary input to the first node in the fault path is established.

The effectiveness of the test is measured by the percentage of possible faults that are detected. Obviously, if the sequence of test vectors applied to the circuit 10 at its primary inputs $PI_o$–$PI_k$ cannot excite a particular fault, or propagate its effect to a primary circuit output, then that fault will go undetected. The percentage of faults detectable by a given test vector sequence can be evaluated by a technique known as fault simulation. To detect whether a particular fault condition (e.g., a stuck-at-one or a stuck-at-zero fault) can be detected at a selected node by a vector sequence, the fault condition is simulated. Thereafter, the test vectors are applied and a check is made whether the vector sequence has excited the simulated fault and propagated its effect to a primary circuit output. If so, then the fault is detectable by the vector sequence.

Test Generation

Testing the sequential circuit 10 by applying one or more sequences of test vectors is effective except in the event that the circuit contains an embedded RAM, such as the RAM 16. In the past, fault values could not be propagated between the node A and one of the primary outputs $PO_o$–$PO_j$ of the circuit 10 along a path 23 (shown in dashed lines) if the fault path passed through the RAM 16. The present invention overcomes this disadvantage by providing a technique for generating a sequence of vectors needed to excite a fault and to propagate its value through an embedded RAM, such as the RAM 16. Generally, the technique involves use of the BACK algorithm described above. However, rather than treat each embedded RAM 16 as if were non-existent, the test vectors are generated in accordance with the invention by propagating fault values forward, through the RAM 16, and by computing the fault sequences backwards through the RAM to the extent necessary to excite a selected node and/or propagate its fault value to a primary circuit output.

The first step in generating test vectors in accordance with the method of the invention is to establish the fault propagation path 23 between a selected node of interest and a primary output of the circuit 10. Having established the fault propagation path, there are three possibilities:

1. The fault propagation path does not pass through the embedded RAM 16;
2. The fault propagation path passes through the RAM 16 and the node of interest is upstream of the RAM; or
3. The fault propagation path passes through the RAM 16 and the node of interest is downstream of the RAM 16.

If the fault propagation path 23 does not pass through the RAM 16, then the test vector sequence needed to propagate the fault value from the node of interest to a primary output of the circuit 10 is generated in the conventional manner using the BACK algorithm, or a similar technique. Consider the circumstance when the fault propagation path 23 passes through the RAM 16. To accomplish testing under this circumstance, the test vector sequence must propagate those values through the RAM 16 that are necessary to propagate the fault effect through the RAM if the fault is upstream of the RAM. By the same token, if the fault is downstream of the RAM 16, the vector sequence must excite this downstream fault. In accordance with the invention, the test vectors are generated to cause the RAM 16 to execute a prescribed sequence of read and/or write operations so that the proper logic values are present on the RAM output lines $O_o$–$O_m$ to propagate the values needed to excite the fault and/or propagate its effect to the primary circuit outputs $PO_o$–$PO_j$.

First, consider the possibility that the fault propagation path 23 lies through the RAM 16 and the node of interest (e.g., Node A) lies upstream of the RAM. In order for the fault effect to propagate to one of the primary outputs $PO_o$–$PO_j$ of the circuit 10, the fault effect must propagate through the RAM 16 in the forward direction. Forward propagation of the fault effect through the RAM 16 is accomplished by causing the RAM to undergo a read or write operation (i.e., a data transfer operation). In this way, the fault effect appearing on one of the data lines $D_o$–$D_m$ of the RAM 16 effectively appears on the RAM output lines $O_o$–$O_m$ during a subsequent interval. Whether a read or write operation is performed depends on the logic value present on the R/W line of the RAM 16. The data transfer operation is performed for both good and faulty circuits.

Operating the RAM 16 to read or write data ultimately propagates the fault effect on one of the RAM data lines $D_o$–$D_m$ to a primary circuit output. However, any fault effect present on the address lines $A_o$–$A_n$ will not be targeted for consideration. For this reason, the test generation algorithm of the invention is not a complete algorithm, although a heavier penalty is imposed on fault effects that propagate through the RAM 16. Hence, if a path exists for a fault value to propagate through the circuit 10 without passing through any embedded RAM 16, that path should be tried first.

Now consider the possibility that the fault propagation path lies through the RAM 16 and the selected node of interest lies downstream of the RAM 16. Under this circumstance, if the fault effect is to reach a primary output of the circuit 10, the fault must first be excited through the RAM 16. Then the fault effect must be propagated from the node to a primary output of the circuit 10. To excite the fault at the node of interest, the fault must be justified backward from the output lines $O_o$–$O_m$ of the RAM 16 to its data lines $D_o$–$D_m$.

Backward fault justification through the RAM 16 is accomplished by the following procedure:

1. Select an output line of the RAM where a fault value D or $\bar{D}$ would be propagated from a corresponding one of the data inputs $D_o$–$D_m$;

2. If any of the address line values are unknown in the current time frame, then the value is set at either a logic "0" or a logic "1," depending on the value that is more controllable. The same address setup is used in the previous time frame;

3. Set the corresponding data input of the RAM with the value D or $\bar{D}$ at the previous time frame during the write operation;

4. Set the logic value for the R/W control line with the logic value needed to effect a read operation in the current time frame and a write operation in the previous time frame;

5. If any conflict arises during steps (2)–(4), then backtrack to the next choice. If no choice is available, then drop the fault from consideration;

6. All logic values set up at the data inputs of the RAM during backward fault effect propagation are propagated to the primary inputs using the justification procedure of the BACK algorithm.

Fault Simulation and Memory Allocation

In order evaluate each test vector sequence generated in the manner described above, a plurality of faults are simulated, and the test vector sequences are applied to determine if the simulated faults can be detected. Various fault simulation techniques exist and are well known in the art. An example is the differential fault simulation PROOFS described in the publication "PROOFS: A Fast, Memory-Efficient Sequential Circuit Fault Simulator," by T. M. Nierman et al., *IEEE Transactions on CAD*, Vol. 11, pages 198–207, February, 1992.

When performing fault simulation, it is useful to record the faulty values in the RAM 16. Unfortunately, if the circuit 10 is large, there may be a large number of values, requiring a greater storage capacity than may be afforded by the RAM 16. For example, if there are z embedded RAMs 16 (where z is an integer greater than zero), each with an n bit address and each y bits wide, the number of bits capable of being stored under fault-free conditions is given by the expression $(2^n)(y)(z)$. The amount of memory required to store the RAM 16 values when the circuit has B faults would be given by the expression $(B)(2^n)(y)(z)$. As may be appreciated, even if each embedded RAM 16 were of a moderate size (e.g., $(2^n)(y)(z)=16$ K bytes), and the circuit had 20 K potential faults, then over three hundred megabytes of RAM storage would be required to store the contents of the RAM 16 for each of the 20 K potential faults.

In accordance with another aspect of the invention, a novel memory allocation scheme has been developed to overcome the problem of memory allocation. During fault simulation, a dynamic link list (containing the RAM 16 values) is created for each undetected fault in the circuit. Each time a fault is simulated for propagation through each embedded RAM 16, only the faulty value different from the corresponding good value is stored. These faulty values are then stored in the dynamic link structure, thus reducing the storage requirement because the all of the values that are present in the RAM are not stored, rather, only the faulty values are stored. The stored record contains the identity of the embedded RAM 16, the address value, and the data value.

When the embedded RAM 16 is read during fault simulation, if a data record (i.e., a fault value) exists in the RAM at the particular address, then the fault value is read out and placed on the output lines $O_o$–$O_m$. Otherwise, the good value is read out. Once the fault is detected, then the dynamic link value (containing the RAM identity, the address of this data value, and the data value ) is then erased. Thus, the only link values that are stored are the values for the undetected values, exactly the information which is desired: By storing only the data values associated with the undetected faults (together with their corresponding RAM addresses and the identity of the RAMs themselves), the amount of required memory is significantly reduced.

Testing of RAM 16

As thus far described, the test technique of the invention has been directed to testing of the circuit 10 as a whole through the application of test vectors to the circuit primary inputs $PI_o$–$PI_k$. In some instances it is desirable to individually test each embedded RAM 16. Testing of each RAM 16 is typically carried out by writing each successive row of storage locations with a first string of known values (typically all zeros or all ones). Thereafter, each successive row is read and the contents of the row just read are compared to the string written during the previous write operate. A match signifies no defects. This process is repeated for different data strings (all zeros, all ones, walking ones, and walking zeros).

Figure 2:
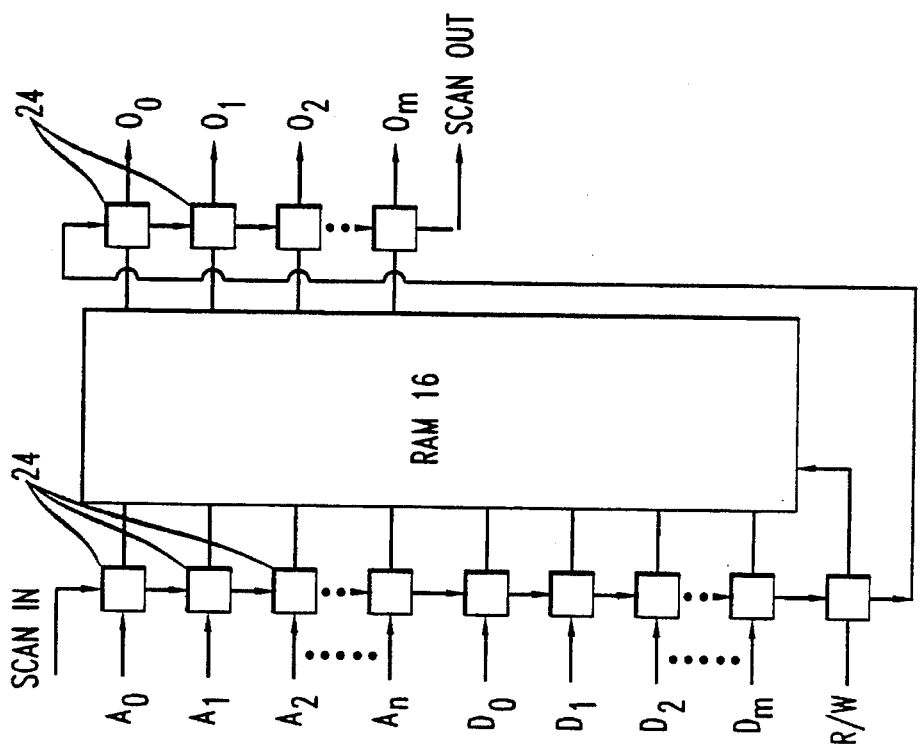
FIG. 2 is a block schematic diagram of the RAM of FIG. 1 configured for full scan-testing.

In the past, the testing of an embedded RAM, such as the RAM 16 in the circuit 10, has been carried out by a technique known as full scan testing. Referring to FIG. 2, full scan testing of the RAM 16 requires that a flip-flop 24 be interposed in each of the address lines $A_o$–$A_n$, each of the data lines $D_o$–$D_m$, the read/write line R/W and each of the output lines $O_o$–$O_m$. The flip-flops 24 are coupled together in a single scan chain to permit each of a sequence of scan vectors to be scanned through the chain of flip-flops. The scan vectors are selected such that when each vector is scanned through the chain of flip-flops, a prescribed address and a prescribed data value are present on the address lines $A_o$–$A_n$ and the data lines $D_o$–$D_m$, respectively, while a prescribed read/write bit is present on the read/write line R/W. If the prescribed read/write bit on the R/W is a "0," then the data value scanned onto the data lines $D_o$–$D_m$ is written into the row of storage cells given by the address scanned onto the address lines $A_o$–$A_n$. By the same token, if the read/write bit scanned onto the read/write line R/W is a "1," then the data value stored at the address scanned onto the address lines $A_o$–$A_n$ is scanned into the flip-flops 24 on the output lines $O_o$–$O_m$.

By appropriately selecting the values of the scan vectors, a known data pattern can be written into each successive row of storage locations in the RAM 16. Thereafter, each successive row of the RAM can be read, and the readout value scanned into the flip-flops 24 on the RAM 16 output lines $O_o$–$O_m$, for comparison to the previously written values. The process of scanning vectors through the chain of flip-flops 24 to write a known bit pattern to the RAM 16, and to read the previously written bit pattern to from the RAM is repeated for a number of different bit patterns.

Full scan testing is subject to several disadvantages. First, full scan testing incurs a relatively large circuit overhead because of the need to interpose a flip-flop 24 in each of the address lines $A_o$–$A_n$, each of the data lines $D_o$–$D_m$, each of the output lines $O_o$–$O_m$, and the read/write line R/W. Second, depending on the number of address lines $A_o$–$S_n$, the number of data lines $D_o$–$D_m$ and the number of output lines $O_o$–$O_m$, the time required to scan each scan vector through the chain of scan flip-flops 24 can be lengthy.

Figure 3:
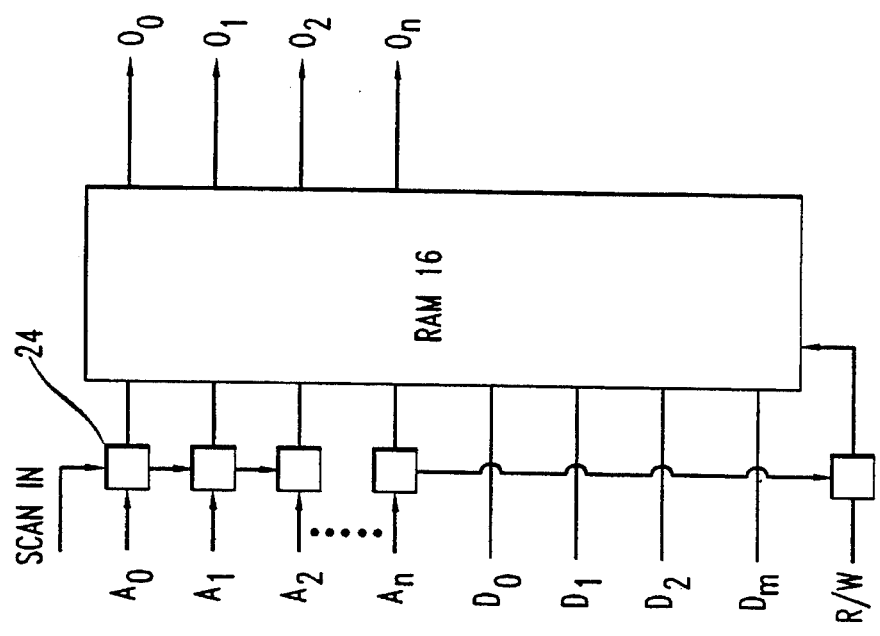
FIG. 3 is a block schematic diagram of the embedded RAM 16 of FIG. 1 configured for partial-scan testing in accordance with the invention.

In accordance with yet another aspect of the invention, a technique is provided for accomplishing partial-scan testing of an embedded RAM, such as the RAM 16, without incurring the above-described disadvantages. Referring to FIG. 3, partial-scan testing of the RAM 16 is accomplished by interposing a flip-flop 24' in each of the address lines $A_o$–$A_n$ and in the read write line R/W. The flip-flops 24' in FIG. 3 are chained together in much the same way as the flip-flops 24 in FIG. 2 to carry out full scan testing. However, during partial-scan testing of the RAM 16 of FIG. 3, the data values that are written into the RAM are not derived by scanning such values through a chain of scan flip-flops as is the case for full scan testing. Rather, the data values written into the RAM 16 are obtained by propagating values from the primary inputs $PI_o$–$PI_k$ to the data lines $D_o$–$D_m$ of the RAM. The BACK algorithm, or a similar algorithm, is utilized to compute the values needed at the primary inputs of the circuit 10 to obtain the desired data values on the RAM 16 data lines $D_o$–$D_m$.

Just as the data values that are written into the RAM 16 are not obtained from the scan vector, the output data on the output lines $O_o$–$O_m$ of the RAM 16 is not scanned out during partial-scan testing as it is during full scan testing. Rather, the data on the output lines $O_o$–$O_m$, of the RAM 16 is propagated to the primary outputs $PO_o$–$PO_j$ of the circuit 10 by the application of appropriately selected test vectors applied to the primary circuit inputs $II_o$–$PI_k$. The vectors needed to propagate the values on the RAM 16 output lines $O_o$–$O_m$, to the circuit 10 primary outputs $PO_o$–$PO_j$ are established by using the BACK algorithm or the like.

Partial-scan testing of the RAM 16 affords several advantages. First, the number of scan flip-flops is reduced. Secondly, the test time is reduced because the chain of scan flip-flops 24' is typically shorter because of the absence of scan flip-flops in the data lines $D_o$–$D_m$ and the output lines $O_o$–$O_m$, of the RAM 16. There is a certain delay associated with propagating the needed values at the circuit 10 primary inputs $PI_o$–$PI_k$ during the reading and writing of the RAM 16. However, the values on the data lines $D_o$–$D_m$ and output lines $O_o$–$O_m$, of the RAM 16 change much less frequently than those on the address lines $A_o$–$A_n$ so that the delay is less than that associated with scanning a scan vector through the chain of scan flip-flops 24 of FIG. 2 in connection with full scan testing.

The foregoing describes a technique for testing a sequential circuit 10 containing an embedded RAM to achieve increased fault coverage.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for testing a sequential circuit, including a least one sequential element and at least one embedded RAM linked to said one sequential element via a propagation path that includes at least one node and which extends from one of a set of primary circuit inputs through the RAM to one of a set of primary circuit outputs, comprising the steps of:

generating at least one sequence of test vectors for application to the primary inputs of the circuit to cause a fault at the node to be excited and to cause its effect to propagate through the RAM to said one of said primary circuit outputs when the node is upstream of the RAM and to cause the fault to be excited through the RAM when the node is downstream thereof, and to cause the fault's effect to be propagated to said one of said primary outputs;

applying the sequence of test vectors to the circuit at its primary inputs to cause the circuit to generate response signals at its primary outputs; and comparing the responses at the circuit outputs to a set of reference values to determine if any differences exist therebetween.

2. The method according to claim 1 wherein the test vectors are generated such that upon application to the sequential circuit, the test vectors cause the RAM to undergo a data transfer operation (i.e., a read or write operation) to cause a fault effect present at an input of the RAM to propagate to an output of the RAM.

3. The method according to claim 1 wherein the test vectors are generated to cause the RAM to execute a prescribed sequence of read and write operations so a predetermined logic value needed to excite a node downstream of the RAM propagates through the RAM to said node to excite it.

4. The method according to claim 3 wherein the test vectors are generated by effecting backward fault effect propagation through the RAM by:

(a) selecting an output terminal of the RAM where a prescribed data value would be propagated from an input of the RAM;

(b) holding each value on each address line of the RAM to a controllable value if the original value is unknown both in a current time frame and in a time frame previous to the current frame;

(c) setting said input value of said RAM with said prescribed data value at said time frame previous to the current frame;

(d) placing a prescribed logic value on a read/write line of the RAM to cause the RAM to undergo a write operation in the time frame previous to the current time frame and to cause the RAM to undergo a read operation in the current time frame, thereby causing the prescribed data value to appear on said RAM output line;

(e) backtracking to an alternative choice if any conflict occurred during steps (b)–(d), provided that an alternative choice exits, otherwise dropping the fault from consideration.

5. The method according to claim 1 further including the steps of:

(a) simulating a set of faults for detection by the test vectors;

(b) dynamically recording values in each said embedded RAM which are associated with faults not detected by said test vectors, together with information as to where such faulty values were found in each RAM and information identifying the RAM.

6. The method according to claim 1 wherein each embedded RAM is itself tested by the steps of:

sequentially applying a separate one of a set of address values to each of a set of address lines of each RAM and applying a read/write value to a read/write line of the RAM by shifting at least one scan vector through a chain of flip-flops each connected to the other and each connected to one of the address lines and the read/write line, respectively;

propagating data values from the primary inputs of the sequential circuit to each of a set of data inputs of the RAM for writing into the RAM; and propagating each of a second set of data values from the primary inputs of the sequential circuit to cause each of a set of data values present at a separate one of a set of RAM outputs to the primary circuit outputs.

* * * * *